(12) United States Patent
Shih et al.

(10) Patent No.: US 6,592,707 B2
(45) Date of Patent: Jul. 15, 2003

(54) CORROSION-RESISTANT PROTECTIVE COATING FOR AN APPARATUS AND METHOD FOR PROCESSING A SUBSTRATE

(75) Inventors: Hong Shih, Walnut, CA (US); Nianci Han, San Jose, CA (US); Jie Yuan, San Jose, CA (US); Joe Sommers, San Jose, CA (US); Diana Ma, Saratoga, CA (US); Paul Vollmer, Lewisbury, OH (US); Michael C. Willson, Troy, OH (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/033,115

(22) Filed: Oct. 22, 2001

(65) Prior Publication Data

US 2002/0066532 A1 Jun. 6, 2002

Related U.S. Application Data

(63) Continuation of application No. 09/532,343, filed on Mar. 21, 2000, now abandoned, which is a continuation of application No. 09/290,969, filed on Apr. 13, 1999, now abandoned.

(51) Int. Cl.$^7$ .......................... H05H 1/00; C23C 16/00
(52) U.S. Cl. .............................. 156/345.1; 156/345.48; 118/715; 118/723 I
(58) Field of Search .............................. 118/715, 723 R, 118/504, 506, 723 I; 156/345.1, 345.48, 275.5; 427/385.5, 409, 388.2, 372.2, 569; 438/710, 706

(56) References Cited

U.S. PATENT DOCUMENTS

| 4,524,092 A | 6/1985 | Cesca et al. ............. 427/388.2 |
| 5,792,562 A | 8/1998 | Collins et al. ............. 428/463 |
| 5,800,871 A | 9/1998 | Collins et al. ........... 427/385.5 |

*Primary Examiner*—Gregory Mills
*Assistant Examiner*—P. Hassanzadeh
(74) *Attorney, Agent, or Firm*—Shirley L. Church; Kathi Bean; Joseph Bach (57) ABSTRACT

A corrosion-resistant protective coating for an apparatus and method of processing a substrate in a chamber containing a plasma of a processing gas. The protective coating or sealant is used to line or coat inside surfaces of a reactor chamber that are exposed to corrosive processing gas that forms the plasma. The protective coating comprises at least one polymer resulting from a monomeric anaerobic chemical mixture having been cured in a vacuum in the absence of oxygen. The protective coating includes a major proportion of at least one methacrylate compound and a minor proportion of an activator compound which initiates the curing process of the monomeric anaerobic mixture in the absence of oxygen or air.

31 Claims, 4 Drawing Sheets

CORROSION-RESISTANT PROTECTIVE COATING FOR AN APPARATUS AND METHOD FOR PROCESSING A SUBSTRATE

This application is a countinuation of Ser. No. 09/532,343 filed Mar. 21, 2000 abandoned which is a countinuation of Ser. No. 09/290,969 filed Apr. 13, 1999 abandoned.

BACKGROUND OF THE INVENTION

1. Field of the Invention

This invention relates generally to a corrosion-resistant protective coating. More specifically, this invention provides a corrosion-resistant protective coating for an apparatus and method of processing (e.g., etching, chemical or physical vapor deposition, etc.) a substrate in a chamber containing a plasma of a processing gas. In particular, this invention provides a corrosion-resistant protective coating or sealant which may be used to line or coat inside surfaces of a reactor chamber that are exposed to corrosive processing gas(es). The protective coating or sealant of the present invention prevents corrosion of the inside surfaces of a reactor chamber while a substrate is being processed in a plasma of a processing gas.

2. Description of the Prior Art

The semiconductor industry in the production of integrated circuit structures on semiconductor wafers relies on high through-put, single structure-processing reactors which can be used for a variety of different processes, such as thermal chemical vapor deposition (CVD), plasma-enhanced CVD (PECVD), plasma-assisted etching, and deposition topography modification by sputtering. The inside surface of the chamber walls of these substrate-processing reactors are subject to attack by chemicals within processing gases used in such processes.

Processing reactor chambers, which contain controlled gaseous environments at reduced pressures, are generally constructed of aluminum, although specialty alloys and materials such as quartz have been used at times. Due to the broad experience of the semiconductor industry with aluminum reaction chambers, an understanding of the effect of the presence of the aluminum upon products produced in the reactors has been developed. Thus, those working in the industry are comfortable with the use of aluminum reaction chambers.

However, more recently, the integrated circuit chip industry has recognized the need for yet higher standards of purity in the processing equipment used to fabricate the integrated circuit structures. It has, therefore, been proposed, by Ohini, in "Fluorine Passivation Technology of Metal Surface", 8$^{th}$ Symposium on ULSI Ultraclean Technology", The Proceedings, Jan. 26–28, 1989, to replace the anodized aluminum chambers with highly polished stainless steel pretreated in HF to remove oxides, passivated with a high purity $F_2$ gas to form a non-stoichiometric iron fluoride, and then thermally treated to form an $FeF_2$ coating. While the resulting film withstands gaseous halogen containing environments, it will corrode if exposed to an aqueous environment.

It has also been proposed by Ohmi, in "Outgas-Free Corrosion-Resistant Surface Passivation of Stainless Steel for Advanced ULSI Process Equipment", ECS Fall Meeting, Chicago, October, 1988 Symposium of Automated IC Manufacturing, to oxidize passivated highly polished stainless steel materials in $O_2$ to form a protective oxide surface thereon. Such surfaces are said to be capable of withstanding visible attack by concentrated aqueous hydrochloric acid, i.e., without any visible evidence of evolution of gas, for as long as 30 to 40 minutes.

While a coating with a resistance to corrosion for 30–40 minutes would not normally be considered sufficient for industrial use, it must be pointed out that exposure to aqueous concentrated mineral acids such as hydrochloric acid is considered to be a worst case test, indicative of much longer resistance to corrosion by gaseous halogens.

Therefore, the use of such highly polished stainless steel materials would apparently satisfy the corrosion resistance requirements of the integrated circuit chip industry. However, the cost of the use of such materials in the construction of processing equipment, such as deposition and etching chambers, is prohibitive. For example, the substitution of an ordinary stainless steel material for aluminum in the construction of an etching or deposition chamber may result in a cost increase of about four times the cost of aluminum.

A ceramic barrier material has been placed on the inside surface of aluminum walls of processing reactor chambers to protect the aluminum walls from the corrosive attack of process halogen gases and plasma. U.S. Pat. No. 5,366,585 to Robertson et al., which is fully incorporated herein by reference thereto, teaches a ceramic barrier material comprising aluminum oxide (e.g. anodized aluminum substrates) for shielding the inner surface of walls of a process reactor chamber from chemical attack, while permitting the utilization of a relatively inexpensive metal to construct the chamber walls.

Lorimer et al. developed a method of forming a corrosion-resistant protective coating on an aluminum substrate, as described in U.S. Pat. No. 5,069,938. The protective coating is formed by first forming a high purity aluminum oxide layer on an aluminum substrate and then contacting the aluminum oxide layer with one or more high purity fluorine-containing gases at elevated temperature. The aluminum oxide layer may be either a thermally formed layer or an anodically formed layer having a thickness from at least about 0.1 micrometer up to about 20 micrometers. The preferred fluorine-containing gases will comprise acid vapors. Examples of fluorine-containing gases include gaseous HF, $F_2$, $NF_3$, $CF_4$, $CHF_3$, and $C_2F_6$. As is evidenced by the process and the description of the finished coating, the fluoride-containing gas penetrated the aluminum oxide (possibly to the aluminum surface beneath) to form fluorine-containing compounds within. The protective coating of Lorimer et al. is intended to protect the chamber walls of the processing apparatus from the chemicals used in chemical vapor deposition and etching processes. However, it has been determined that a thermal or anodized aluminum oxide coating of 20 micrometers or less on an aluminum surface does not prevent the gradual build up of fluoride-containing compounds such as aluminum trifluoride ($AlF_3$), ammonium fluoride ($NF_4F$), and aluminum oxyfluorides ($AlO_xF_y$) upon the outer surface of the coating. These compounds eventually peel off from the surface of the coating and become a source of particulate contamination.

Copending, commonly assigned U.S. patent application having Ser. No. 08/770,092, filed Dec. 19, 1996 and entitled "Boron Carbide Parts and Coating in a Plasma Reactor," and incorporated herein by reference thereto, teaches the use of a $B_4C$ layer for protecting reactor chamber walls manufactured of aluminum alloy or aluminum alloy having a formed aluminum oxide layer. While the $B_4C$ layer makes an excellent bond with aluminum alloy or an aluminum oxide layer supported by an aluminum alloy, the surface of the $B_4C$ layer contains uniformly distributed fine pores (x5000) wherethrough electrolytes and reactive processing gases may pass and contact the aluminum alloy surface or the surface of the aluminum oxide layer being supported by an aluminum alloy, causing undercut corrosion. For example, if the reactive processing gas contains chlorine, during an etching process chlorine passes through the uniformly distributed fine pores of the $B_4C$ layer and contacts an aluminum-containing surface to react therewith to produce aluminum chloride. When the $B_4C$ layer is exposed to moisture or water, aluminum chloride reacts with water to produce aluminum hydroxide and hydrochloric acid which penetrates through the fine pores of the $B_4C$ layer to contact and react with the aluminum-containing surface to produce additional aluminum chloride, which reacts with water to produce additional aluminum hydroxide and additional hydrochloric acid. The produced aluminum hydroxide expands, creating stress on the $B_4C$ layer and delamination of the $B_4C$ layer appears.

Therefore, what is needed and what has been invented is a corrosion-resistant protective coating for a $B_4C$ layer supported by an aluminum material, where the corrosion-resistant protective coating is capable of resisting the corrosive attack of process halogen gases and plasma (as measured by accelerated corrosion resistance tests using concentrated aqueous acids). What is further needed and what has been invented is a high purity corrosion-resistant protective coating which may be utilized on the surface of a ceramic layer (e.g., $B_4C$) supported by aluminum-containing parts used in vacuum process chambers so that aluminum may continue to be utilized in the construction of semiconductor wafer processing equipment for the integrated circuit chip industry without sacrificing purity standards.

SUMMARY OF THE INVENTION

In accordance with the present invention, a corrosion-resistant protective coating is provided to protect the inside surfaces of a reactor chamber containing corrosive processing gases which are used for processing (e.g., etching, chemical or physical vapor deposition, etc.) A substrate in the reactor chamber. The corrosion-resistant protective coating is preferably placed on a chamber wall of the reactor chamber. The protective coating of the present invention preferably comprises at least one polymer resulting from a monomeric anaerobic chemical mixture having been cured in the absence of oxygen. Preferably, the monomeric anaerobic chemical mixture comprises a major proportion of at least one methacrylate compound and a minor proportion of an activator compound (i.e., a polymerization catalyst) which initiates the curing process in the absence of oxygen or air. The monomeric anaerobic chemical mixture more particularly includes from about 30% by wt. to about 95% by wt. tetraethylene glycol dimethacrylate, from about 4% by wt. to about 50% by wt. 2-hydroxyethyl methacrylate, and from about 1% by wt. to about 5% by wt. Cumene hydroperoxide.

The present invention broadly provides a chamber assembly for processing substrates in a plasma (e.g. an inductively coupled RF plasma of a processing gas) comprising a processing chamber including a processing zone wherein substrates (i.e. semiconductor substrates) are processed. The processing chamber also includes the protective coating. Preferably, the protective coating is disposed on the chamber wall of the processing chamber. A pedestal assembly including a chuck assembly is disposed in the processing zone and has a receiving surface (more specifically, a puck member with a receiving surface) for receiving a substrate. The chamber assembly further comprises a processing power source, and a processing gas-introducing assembly engaged to the chamber wall for introducing a processing gas into the processing zone of the chamber wall. A processing power-transmitting member is connected to the processing power source for transmitting power into the processing zone to aid in sustaining a plasma from a processing gas within the processing zone of the processing chamber. The chamber assembly is part of a plasma reactor for processing substrates. A dielectric window, such as one having a generally dome-shaped configuration, is supported by the chamber wall. The processing power-transmitting member may be disposed in proximity to the dielectric window and may further be a coiled inductor or an antenna. The processing power source may be selected from the group consisting of an RF power source, a magnetron power source, and a microwave power source.

The present invention also broadly provides a method of processing (e.g., etching, chemical or physical vapor deposition, etc.) a layer (e.g., a metal layer, a dielectric layer, etc.) on a substrate comprising the steps of:

a) providing a substrate;
b) disposing the substrate in a reactor chamber containing a structure (e.g. a chamber wall) with a protective coating comprising a polymerized coating resulting from having cured a monomeric anaerobic chemical mixture (e.g., a mixture of tetraethylene glycol dimethacrylate, 2-hydroxyethyl methacrylate, and cumene hydroperoxide);
c) introducing a processing gas into the reactor chamber of step (b); and
d) introducing processing power into the reactor chamber of step (b) to process a layer on the substrate in a plasma of the processing gas.

The foregoing provisions along with various ancillary provisions and features which will become apparent to those skilled in the art as the following description proceeds, are attained by this novel apparatus and method, a preferred embodiment thereof shown with reference to the accompanying drawings, by way of example only, wherein:

DESCRIPTION OF THE PREFERRED EMBODIMENT

Figure 1:
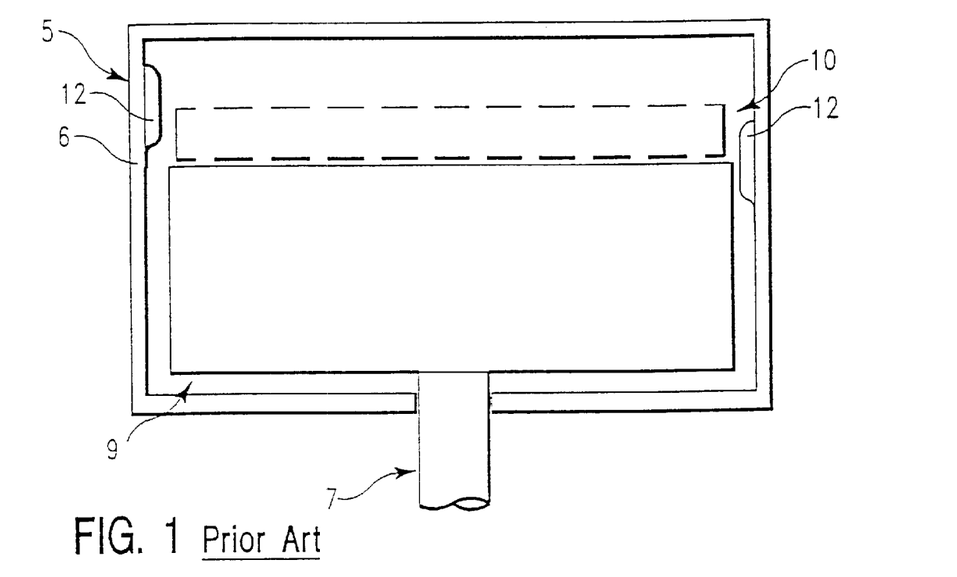
FIG. 1 is a schematic view of a process chamber wherein semi-conductor wafers are processed by plasma etching.

Referring in detail now to the drawings, wherein similar parts of the invention are identified by like reference numerals, there is seen a process chamber, schematically illustrated as 5 in FIG. 1, including a chamber wall 6 enclosing a pedestal assembly, generally illustrated as 7, having a chuck assembly, generally illustrated as 9. The chuck assembly 9 supports a substrate, such as substrates or semiconductor wafers 10, while being processed within the process chamber 5, such as by plasma etching for patterning integrated circuit (IC) metal interconnect devices. Other forms of processing substrates which are included within the spirit and scope of the present invention include chemical vapor deposition and physical vapor deposition. During the plasma process, processing power (e.g., RF power, magnetron power, microwave power, etc.) passes through a dielectric member, which includes a dielectric window of a nonconductive material such as a ceramic dome, etc., and becomes coupled to a plasma of the processing gas. If the plasma process is plasma etching, metal etching of metals (e.g. platinum, copper, aluminum, titanium, ruthenium, iridium, etc.) is conducted while being supported by substrates.

During plasma etching of a conductive layer (not shown) supported by the substrate 10, a residue 12 (as shown in FIG. 1) forms on the inside surface of the chamber wall 6 and/or on other structures within the process chamber 5. The inside surface of the chamber wall 6 would typically include a wall layer (e.g. an aluminum oxide film) supported by a metal structure or substrate which typically comprises aluminum. The residue 12 is typically complex in that it contains etchants and reaction byproducts, as well as inorganic materials. If the conductive layer that is being etched consists of a conductive metal (e.g. platinum), then the residue 12 would contain the conductive metal, as well as oxides and silicon-containing material, especially if a silicon-containing mask layer (e.g. a $SiO_2$ or $Si_3N_4$ mask layer) is employed during the conductive metal etch process. If the etchant gas contains a corrosive gas, such as a halogen (e.g. $Cl_2$) or a halogen-source gas (e.g. HBr, $BCl_3$, etc.), then the residue 12 would be a corrosive residue which may form corrosive salts and/or corrosive acids. For example, if the etchant gas comprises chlorine, which is one of the preferred gases for etching a conductive metal, then the residue 12 would contain corrosive chlorine which may react with moisture ($H_2O$) to form hydrochloric acid (HCl) that can permeate into the chamber wall 6 or any wall layer supported thereby and cause post-etch corrosion of the chamber wall 6 including any wall layer. If the etchant gas comprises fluorine ($F_2$) or a fluorine source, then the residue 12 would include fluoride-containing compounds, such as aluminum trifluoride ($AlF_3$), ammonium fluoride ($NH_4F$), and aluminum oxyfluorides ($AlO_xF_y$) that would gradually build up upon the other surface of the chamber wall 6 or upon any wall layer supported thereby. These compounds eventually peel off from the surface of the wall layer or the chamber wall 6 and become a source of particulate contamination.

As disclosed in commonly owned U.S. Pat. No. 5,366,585 to Robertson et al., fully incorporated herein by reference thereto as if repeated verbatim immediately hereinafter, conventional semiconductor wafer processing apparatus use aluminum chambers comprising aluminum walls (i.e. aluminum substrates) supporting an anodized surface of aluminum (i.e. an aluminum oxide layer or film). The anodized surface of aluminum or aluminum oxide is electrically leaky, permitting current leakage to the conductive aluminum beneath and, therefore, attraction of plasma toward the anodized aluminum surface. The top layer of anodized aluminum is porous and has poor electrical insulation properties. This layer has a high degree of contamination ($H_2O$, $SO_3$, Cr or other species) from the anodizing process and reacts chemically differently from the pure material. Channels extend vertically through the top layer to within a few hundred angstroms of the underlying aluminum substrate affording passage for an electrically conductive plasma so that only the bottom layer of 200 angstroms or so acts as an electrical barrier to the plasma. The bottom layer is the barrier layer which is a good electrical insulator and is a more dense, pure aluminum oxide. Typically anodized aluminum total thickness is limited to less than 0.005 inches (approximately 130 microeters) of which only a few hundred angstroms (hundredths of micrometers) are the barrier layer. Thus, anodized aluminum does not significantly act to confine the plasma and does not sufficiently aid in reducing the build-up of residue 12 or in reducing arcing from a plasma-generating electrode toward the anodized aluminum surface. Also, it is still necessary to clean residue 12 off the aluminum chamber walls 6 of the process chamber 5.

Prior to removing the residue 12, the residue 12 may convert into corrosive salts and/or corrosive acids which could corrosively attack the layer(s) of the anodized aluminum or aluminum oxide and reach the underlying aluminum substrate of the aluminum chamber wall 6 and also corrosively attack the same. Furthermore, if the process chamber 5 having aluminum chamber walls 6 is being employed for metal etching with an etchant gas comprising chlorine, during the etching process chlorine permeates the channels of the top layer of anodized aluminum, and into and through the anodized aluminum barrier layer (i.e. the bottom layer) to react with exposed aluminum of the aluminum substrate to form $AlCl_3$ (i.e. $2Al+3Cl_2 \rightarrow 2AlCl_3$). When $AlCl_3$ is exposed to moisture ($H_2O$), aluminum oxide and hydrogen chloride are formed (i.e. $AlCl_3 + 3H_2O \rightarrow Al(OH)_3 + 3HCl$, and $2Al(OH)_3 \rightarrow Al_2O_3 \cdot 3H_2O$). Hydrogen chloride can penetrate to the aluminum substrate and react with aluminum to generate hydrogen and produce aluminum chloride which reacts with moisture ($H_2O$) to produce aluminum hydroxide ($Al(OH)_3$) (e.g. $Al+3HCl \rightarrow AlCl_3+(3/2)H_2$, and $AlCl_3+3H_2O \rightarrow Al(OH)_3+3HCl$). Because aluminum hydroxide is expansive due to its large volume, it creates stress and expansion on the aluminum oxide barrier layer(s) which subsequently causes delamination by breakdown of the aluminum oxide barrier layer(s).

Copending, commonly assigned U.S. patent application Ser. No. 08/770,092, filed Dec. 19, 1996 and entitled "Boron Carbide Parts and Coatings in a Plasma Reactor," teaches disposing (e.g. by thermal spraying or chemical vapor disposition) boron carbide ($B_4C$), a ceramic liner, on the interior surfaces, such as the anodized aluminum layer(s), of a plasma etch reactor to protect the interior surfaces from the plasma which typically includes a corrosive chlorine source (e.g. $Cl_2$, $BCl_3$, etc.). However, the boron carbide coating is not sufficiently resistant to high-density plasma etchants, such as $BCl_3$ and $Cl_2$, and would undergo the same delamination process from corrosive etchant gas that was shown for the anodized aluminum or aluminum oxide layer(s) (i.e. ceramic layer(s)). More specifically, if the reactive processing gas contains chlorine, during an etching process chlorine passes through the uniformly distributed fine pores of the $B_4C$ layer, through the aluminum oxide layer(s) and contacts aluminum on the surface of the aluminum substrate to react therewith to produce aluminum chloride. When the $B_4C$ layer is exposed to moisture or water which seeps therethrough, aluminum chloride reacts with water to produce aluminum hydroxide and hydrochloric acid which penetrates through the pores of the aluminum oxide layer(s) to contact and react with the aluminum-containing surface of the aluminum substrate to produce additional aluminum chloride, which reacts with additional water to produce additional aluminum hydroxide and additional hydrochloric acid. The produced aluminum hydroxide expands, creating stress on the aluminum oxide layer(s) and the $B_4C$ layer, and delamination of the aluminum oxide layer(s) and the $B_4C$ layer results.

In order to protect a reactor chamber surface from corrosive residue 12 and/or corrosive etchant gas, such as halogen source or halogen-containing gases (e.g. $Cl_2$, $BCl_3$, $F_2$, etc.), the protective coating of the present invention is disposed on the reactor chamber surface. The protective coating may be applied directly to the surface of a metal structure (e.g. an aluminum or stainless steel structure) within the reactor chamber, or directly onto a barrier layer (e.g. aluminum oxide or other metal-oxide ceramic layer(s)) that is being supported by the metal structure within the reactor chamber, or directly onto a ceramic barrier liner or coating (e.g. boron carbide, $B_4C$) which has been deposited onto the barrier layer.

The barrier layer may be any suitable barrier layer, but is generally a ceramic barrier layer that typically comprises aluminum oxide since this is relatively inexpensive and readily available. The aluminum oxide should be sufficiently pure that it does not "out-gas" or include contaminants that could be sputtered onto the substrate during process operation, and it should be chemically stable when exposed to the particular etching processes contemplated. The aluminum oxide or other metal-oxide ceramic layer(s) can be a single crystal oxide, polycrystalline oxide, or amorphous oxide. Flame sprayed or plasma sprayed aluminum oxide can also be used to form the ceramic barrier layer or material. The term "aluminum oxide", as used herein, is intended to include both fully dehydrated aluminum oxide, i.e., $Al_2O_3$ (alpha alumina), as well as hydrated forms of aluminum oxide, e.g., $Al(OH)_3$ (bayerite) or $AlO(OH)$ (boehmite). Other materials which can be used to form the barrier layer include by way of illustration, but are not limited to, the oxide and fluoride forms of magnesium and tantalum, as well as the fluoride forms of aluminum. The thickness of the barrier layer is typically at least about 0.005 inches (130 micrometers), and preferably ranges from about 0.01 inches (250 micrometers) to about 0.25 inches (6.4 millimeters).

The ceramic barrier liner or coating may not only be boron carbide, but may be any other suitable ceramic barrier coating. Thus, the ceramic barrier liner or coating may be selected from the group consisting of aluminum oxide, aluminum nitride, boron carbide, boron nitride, silicon carbide, silicon nitride, zirconium oxide, and mixtures thereof. The thickness of the ceramic barrier liner or coating is typically at least about 0.001 inches, preferably ranging from about 0.001 inches to about 0.20 inches, more preferably from about 0.005 inches to about 0.01 inches.

The protective coating of the present invention broadly comprises a polymerized mixture/coating (i.e. at least one polymer) resulting from having cured an anaerobic adhesive/sealant in the absence of air or oxygen. More specifically, the protective coating comprises a crosslinked, thermoset plastic resulting from or being the product of curing at room temperature (e.g. 60° F. to 80° F.) a monomeric anaerobic mixture of chemical compounds in the absence of air or oxygen. Stated alternatively, the protective coating comprises at least one polymer (i.e. a crosslinked plastic polymer) resulting from curing a monomeric anaerobic mixture in the absence of oxygen. In a preferred embodiment of the present invention, the monomeric anaerobic mixture comprises a major proportion of at least one methacrylate compound and a minor proportion of an activator agent (i.e. a polymerization catalyst) that initiates the curing process in the absence of oxygen or air. Preferably, the monomeric anaerobic mixture comprises from about 30% by weight to about 95% by weight tetraethylene glycol dimethacrylate, from about 4% by weight to about 50% by weight 2-hydroxyethyl methacrylate, and from about 1% by weight to about 5% by weight of the activator agent. More preferably, the monomeric anaerobic mixture comprises from about 40% by wt. to about 90% by weight tetraethylene glycol dimethacrylate, from about 5% by wt. to about 40% by weight 2-hydroxyethyl methacrylate, and from about 2% by weight to about 4% by weight of the activator agent. Most preferably, the monomeric anaerobic mixture comprises from about 60% by weight to about 80% by weight (e.g. about 70% by weight) of tetraethylene glycol dimethacrylate, from about 10% by weight to about 30% by weight (e.g. about 27% by weight) of 2-hydroxyethyl methacrylate, and from about 2.5% by weight to about 3.5% by weight (e.g. about 3% by wt.) of the activator agent. The activator agent may be any suitable polymerization catalyst. Preferably, the activator agent comprises cumene hydroperoxide. Suitable monomeric anaerobic mixtures for forming the protective coating of the present invention may be commercially purchased under the trademark PERMA-LOK® LM, PERMA-LOK® MM 115, PERMA-LOK® HH 120, PERMA-LOK® HL 126, PERMA-LOK® HM 128, and Emralon RC-369, all from National Starch & Chemical Company, Bridgewater, N.J. A more preferred monomeric anaerobic mixture is PERMA-LOK® HL 126. The thickness of the protective coating is typically at least about 0.0005 inches, preferably ranging from about 0.0005 inches to about 0.4000 inches, more preferably from about 0.005 inches to about 0.02 inches, most preferably from about 0.008 inches to about 0.01 inches.

Figure 2:
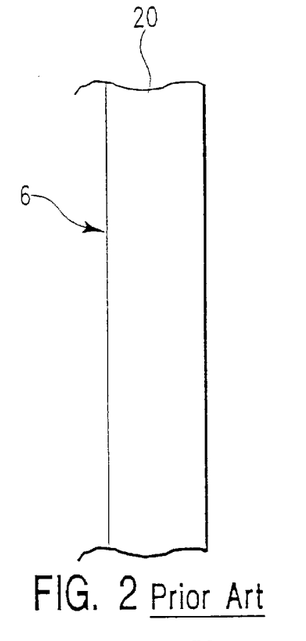
FIG. 2 is a sectional, side elevational view of a portion of a chamber wall consisting of a metal structure or substrate.
Figure 3:
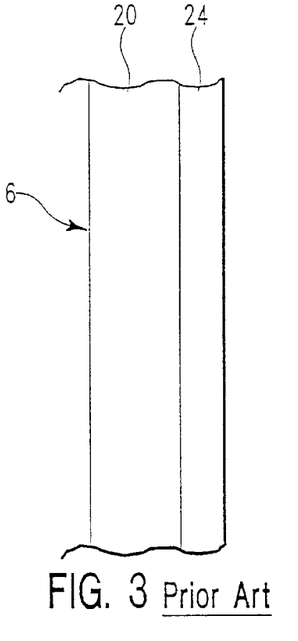
FIG. 3 is a sectional, side elevational view of a chamber wall consisting of a metal substrate supporting a ceramic barrier layer.
Figure 4:
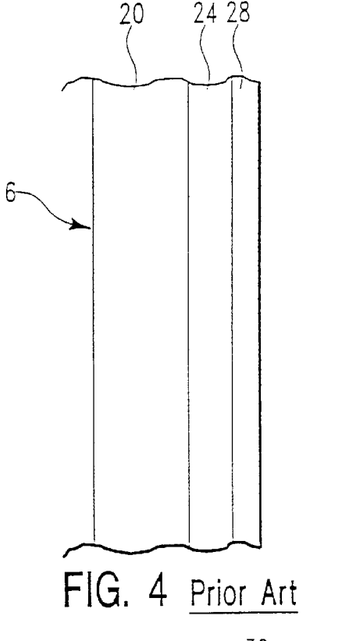
FIG. 4 is a sectional, side elevational view of a chamber wall consisting of a metal substrate supporting a ceramic barrier layer which supports a ceramic barrier coating.

The protective coating of the present invention may be disposed on any suitable structure within the process chamber 5 by any suitable procedure. By way of example only and referring to FIGS. 2–4, there is seen various embodiments of a section of the chamber wall 6 which may be used to form part of the processing chamber 5. In FIG. 2. and FIG. 3, there is seen the chamber wall 6 respectively including a metal structure or substrate 20 (e.g. aluminum), and including the metal substrate 20 supporting a ceramic barrier layer 24 (e.g. ceramic aluminum oxide). There is seen in FIG. 4 the metal substrate 20 supporting the ceramic barrier layer 24 which in turn is supporting a ceramic barrier coating 28 (e.g. $B_4C$). The protective coating, generally illustrated as 30 in FIGS. 11–13, is preferably formulated and disposed on a desired surface of the various embodiments of the chamber wall 6 in FIGS. 2–4 by applying to the desired surface under vacuum conditions and in the absence of air or oxygen, a single layer of coating 30a or two layers of coatings 30a and 30b (see FIGS. 5–10) of one of the preferred embodiments of the previously mentioned monomeric anaerobic mixtures. More specifically, a uniform layer or coating 30a of the selected monomeric anaerobic mixture is initially applied (e.g. by brushing, spraying, etc.) on the metal substrate 20 in FIG. 2, on the ceramic barrier layer 24 in FIG. 3, and on the ceramic barrier coating 28 in FIG. 4. The ceramic barrier layer 24 and the ceramic barrier coating 28 typically possess pores and interstices which interstitially receive some of the coating 30a. Any surfaces which are to receive the coating 30a may be initially rougher such that the surface finish has a peak-to-valley roughness height with an average height value ranging from about 50 Å to about 1000 Å (see technical manual entitled WYKO Surface Profilers Technical Reference Manual, published by WYKO Corp. of Tucson, Ariz. for procedure for obtaining a peak-to-valley roughness height of a surface finish). The thickness of the uniform layer or coating 30a is typically at least about 0.00025 inches, preferably ranging from about 0.00025 inches to about 0.2000 inches, more preferably from about 0.0025 inches to about 0.01 inches, and most preferably from about 0.004 inches to about 0.005 inches.

Figure 5:
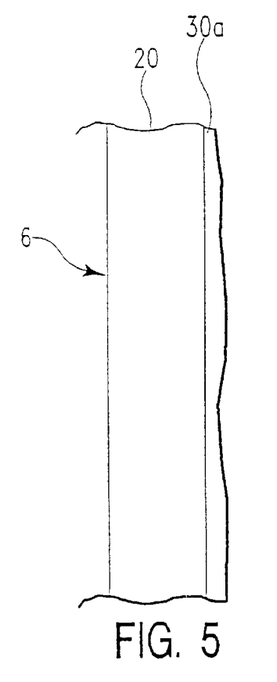
FIG. 5 is side elevational view of the chamber wall of FIG. 2 after a first monomeric anaerobic chemical mixture was disposed on the metal substrate.
Figure 6:
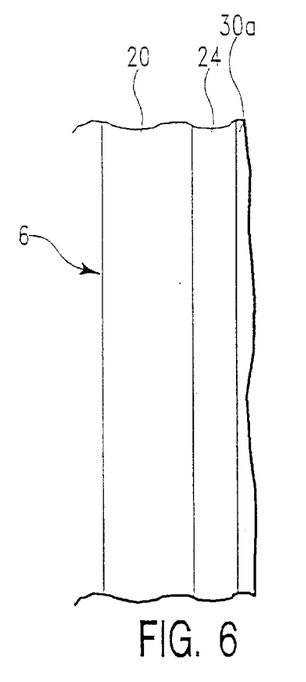
FIG. 6 is a side elevational view of the chamber wall of FIG. 3 after a first monomeric anaerobic chemical coating was disposed on the ceramic barrier layer which is supported by the metal substrate.
Figure 7:
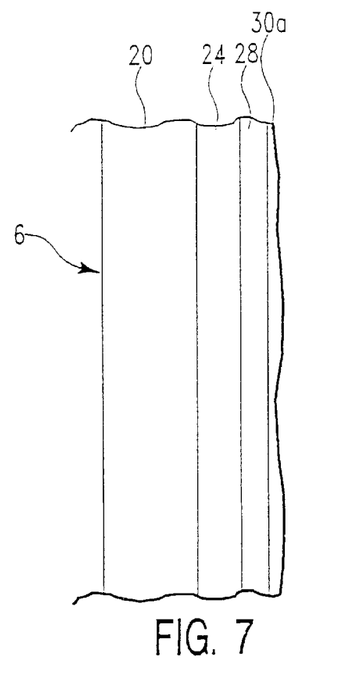
FIG. 7 is a side elevational view of the chamber wall of FIG. 4 after a first monomeric anaerobic coating was disposed on the ceramic barrier coating which is supported by the ceramic barrier layer that is being supporting by the metal substrate.

After applying the coating 30a it is allowed to sit or remain on each of its respective associated surfaces at room temperature in the presence of air or oxygen for a desired period of time, such as from about 3 minutes to about 1 hour, preferably from about 10 minutes to about 20 minutes. Air or oxygen prevents coating 30a from curing and polymerizing. FIG. 5 is a side elevational view of the chamber wall 6 from FIG. 2 after coating 30a was disposed on the metal substrate 20. FIG. 6 is a side elevational view of the chamber wall 6 from FIG. 3 after coating 30a was disposed on the ceramic barrier layer 24 which is supported by the metal substrate 20. FIG. 7 is a side elevational view of the chamber wall 6 from FIG. 4 after coating 30a was disposed on the ceramic barrier coating 28 which is supported by the ceramic barrier layer 24 that is being supported by the metal substrate 20.

After coating 30a has been disposed on a desired surface of the various embodiments of the chamber wall 6 in FIGS. 2–4, coating 30b is applied (e.g. by brushing, spraying, etc.) to and over coating 30a in a procedure similar to the procedure in which coating 30a was disposed on each of its respective associated surfaces; and both coatings 30a and 30b are subsequently cured in a vacuum chamber (not shown) in the absence of air or oxygen. More particularly, a uniform layer or coating 30b of the selected monomeric anaerobic mixture is applied (e.g. by brushing, spraying, etc.) to the coating 30a in FIGS. 5–7. The thickness of applied coating 30b is typically approximately the same as the thickness of previously applied coating 30a; that is at least about 0.00025 inches, preferably ranging from about 0.00025 inches to about 0.2000 inches, more preferably from about 0.0025 inches to about 0.01 inches, and most preferably from about 0.004 inches to about 0.005 inches.

Figure 8:
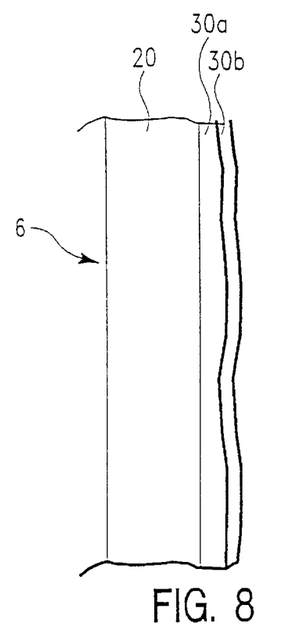
FIG. 8 is a side elevational view of the chamber wall of FIG. 5 after a second monomeric anaerobic coating was applied over the first monomeric anaerobic coating.
Figure 9:
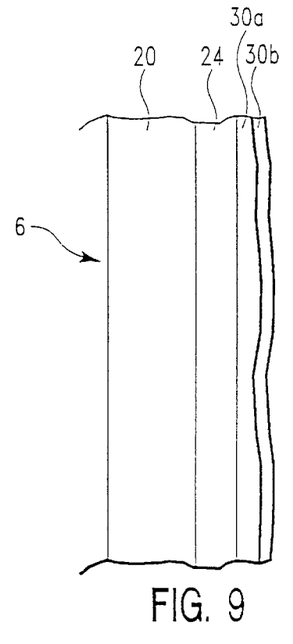
FIG. 9 is a side elevational view of the chamber wall of FIG. 6 after a second monomeric anaerobic coating was applied over the first monomeric anaerobic coating.
Figure 10:
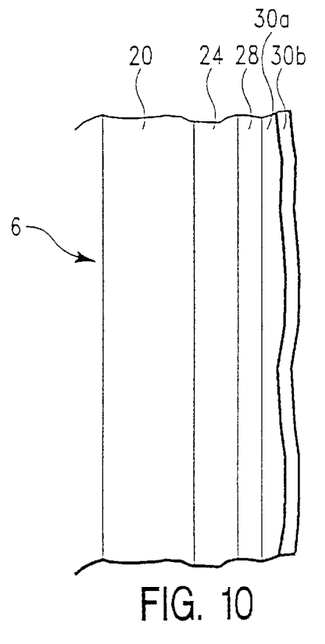
FIG. 10 is a side elevational view of the chamber wall of FIG. 7 after a second monomeric anaerobic coating was applied over the first monomeric anaerobic coating.
Figure 11:
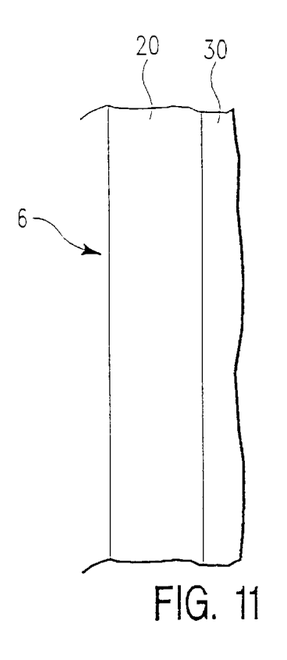
FIG. 11 is a side elevational view of the chamber wall of FIG. 8 after the first and second monomeric anaerobic coatings were cured.
Figure 12:
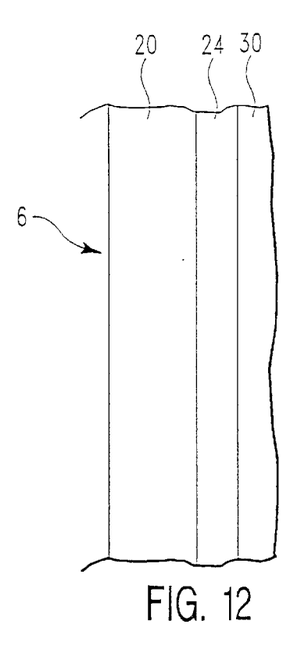
FIG. 12 is a side elevational view of the chamber wall of FIG. 9 after the first and second monomeric anaerobic coatings were cured.
Figure 13:
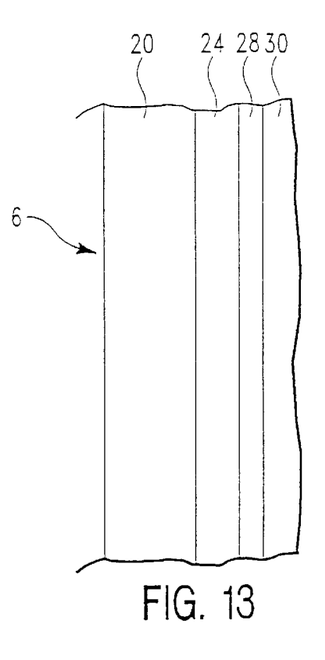
FIG. 13 is a side elevational view of the chamber wall of FIG. 10 after the first and second monomeric anaerobic coatings were cured and allowed to polymerized.

After applying the coating 30b on and/or over the entire coating 30a on each of the respective associated surfaces as illustrated in FIGS. 8–10, both coatings 30a and 30b of the monomeric anaerobic mixture are subsequently cured and allowed to polymerize to produce the protective 30 as shown in FIGS. 11–15. Coatings 30a and 30b of the monomeric anaerobic mixture may be cured and allowed to polymerize in any suitable manner, preferably in a vacuum chamber (not shown) in the absence of air and oxygen. The vacuum chamber may be any suitable vacuum chamber, well known to those possessing ordinary skill in the art. The vacuum chamber has an internal rotatable supporting structure (not shown) for supporting and rotating the chamber wall 6 during curing of the coatings 30a and 30b. The internal rotatable supporting structure typically rotates during the curing process at any suitable revolution rate. The time to fully cure the monomeric anaerobic coatings 30a and 30b generally varies, depending on the combined thickness of coatings 30a and 30b. As previously mentioned, the thickness of the protective coating 30 as best shown in FIGS. 11–13, is typically at least about 0.0005 inches, preferably ranging from about 0.0005 inches to about 0.4000 inches, more preferably from about 0.005 inches to about 0.02 inches, most preferably from about 0.008 inches to about 0.01 inches.

Although the invention has been illustrated by applying the monomeric anaerobic coatings 30a and 30b to the chamber wall 6, it is to be understood that the spirit and scope of the present invention includes application of the coatings 30a and 30b to other structures within the plasma process chamber 5, such as gas distribution plates (GDPs) and chamber lids. It is to also be understood that the process chamber 5 may be a processing zone or chamber of any type of plasma processing apparatus, such as an inductively coupled plasma reactor, generally illustrated as 18 in FIG. 14. The inductively coupled plasma reactor 18 in FIG. 14 comprises a dielectric discharge chamber 34 that is circumferentially surrounded by a multiturn, non-resonant cylindrical rf coil 36 (i.e. helical rf inductive coil 36) that is coupled to an RF power source 38. The dielectric discharge chamber 34 communicates with a process chamber 40 which is surrounded by one or more multidipole permanent magnets 42 to increase radial plasma uniformity. Process chamber 40 has a chamber wall 41 which supports the protective coating 30. As was seen for the process chamber 5 of FIG. 1, chuck assembly 9 is disposed in the process chamber 40 for receiving and supporting substrates (including semiconductor wafers 10) on its associated receiving surface. Pedestal assembly 7 is electrically coupled to bias RF source 43.

Figure 14:
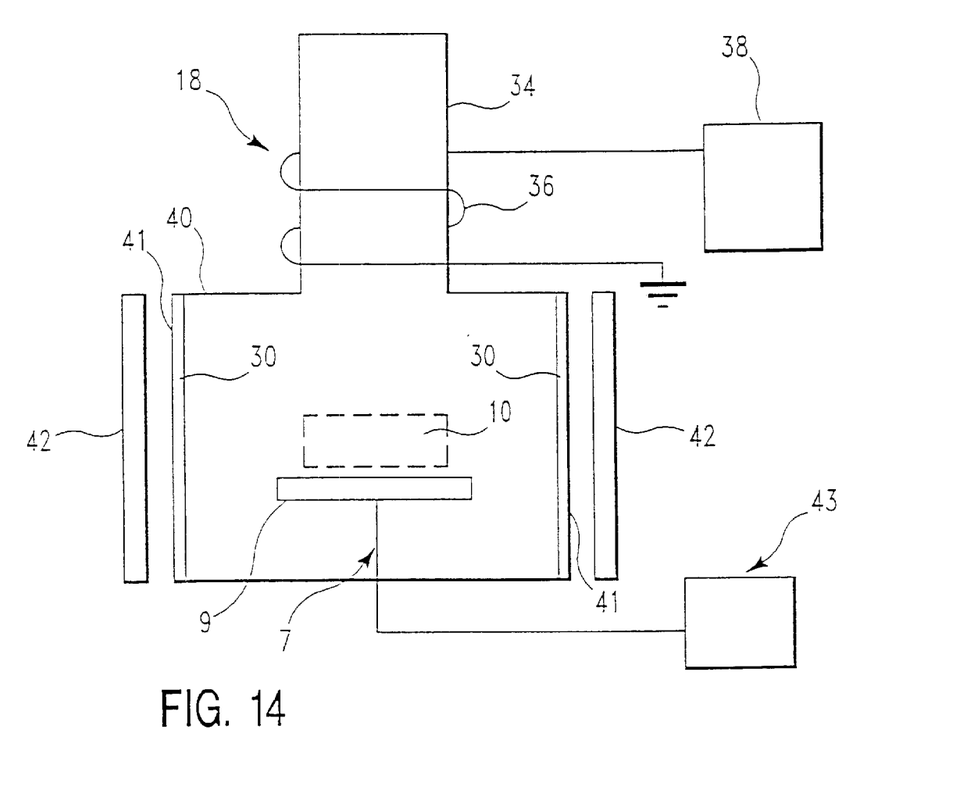
FIG. 14 is a schematic view of an inductively coupled plasma reactor having a process chamber including a chamber wall which supports the protective coating of the present invention.

Inductively coupled plasma reactors, such as reactor 18 in FIG. 14, are currently used to perform various processes on semiconductor wafers including metal etching, dielectric etching, chemical vapor deposition, and physical vapor deposition, as some examples. In an etch process, one advantage of an inductively coupled plasma is that a high density plasma ion density is provided to permit a large etch rate with a minimal plasma D.C. bias, thereby permitting more control of the plasma D.C. bias to reduce device damage. For this purpose, the source power applied to the inductive coil and the D.C. bias power applied to the wafer pedestal are separately controlled RF supplies. Separating the bias and source power supplies facilitates independent control of ion density and ion energy, in accordance with well-known techniques. Plasma in an inductive source is created by application of rf power to a non-resonant inductive coil, such as helical coil 36 in FIG. 14, or a planar coil (not shown) for a close-coupled or planar source geometry as shown and described on pages 52–53 of an article entitled "Design of High-Density Plasma Sources" by Lieberman et al from Volume 18 of *Physics of Thin Films*, copyright 1994 by Academic Press Inc. of San Diego, Calif. The application of rf power to a non-resonant inductive coil results in the breakdown of the process gas within a dielectric discharge chamber, such as the dielectric discharge chamber 34 in FIG. 14, by the induced rf electric field which passes through the dielectric discharge chamber. Therefore, the coil inductor provides RF power which ignites and sustains the plasma of the processing gas.

Figure 15:
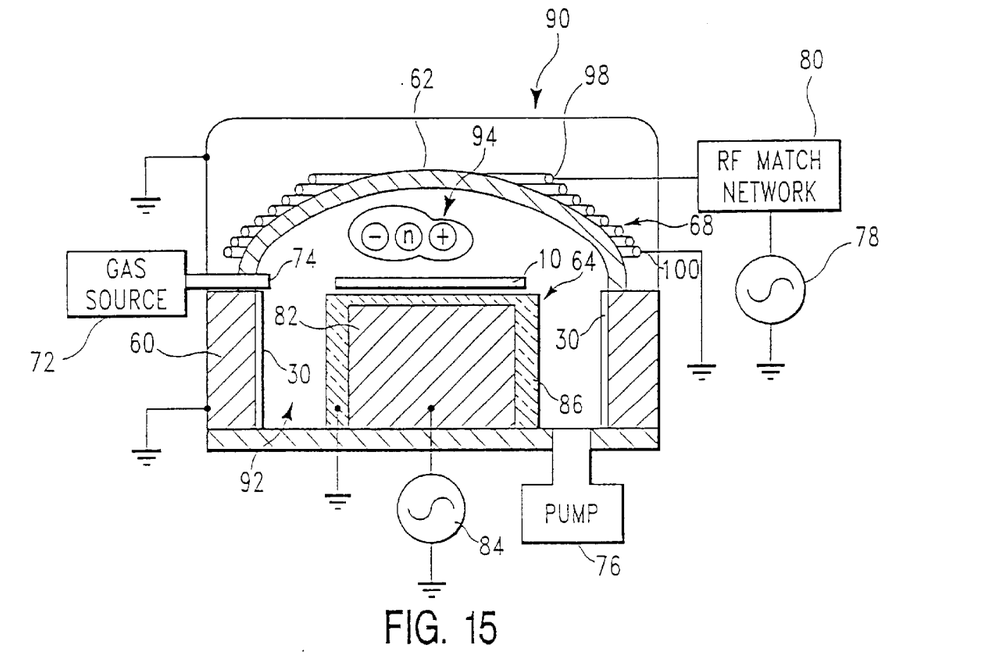
FIG. 15 is a side elevational view of an inductively coupled plasma reactor including a process chamber having a chamber wall supporting the protective coating of the present invention.
Figure 16:
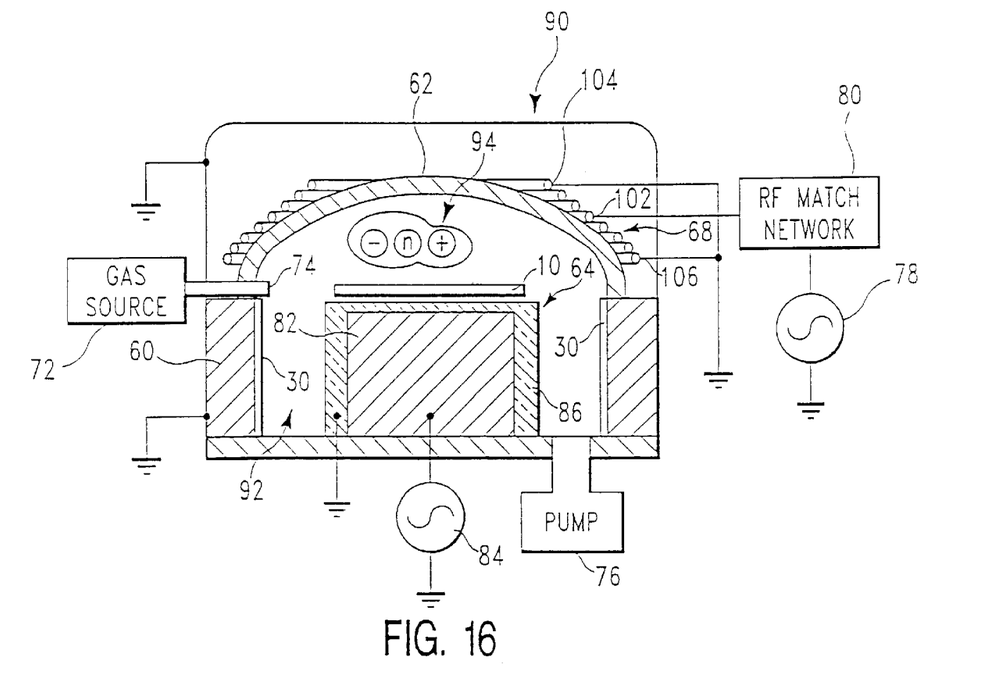
FIG. 16 is a side elevational view of another inductively coupled plasma reactor including a process chamber having a chamber side wall supporting the protective coating of the present invention.

A preferred inductively coupled plasma reactor for employing the protective coating 30 of the present invention is that which inductively couples a plasma in a decoupled plasma source etch chamber sold under the trademark DPS™ owned by Applied Materials, Inc., 3050 Bowers Avenue, Santa Clara, Calif. 95054–3299. The DPS™ brand etch chambers decouple or separate the ion flux to the semiconductor wafer 10 from the ion acceleration energy and may be any of the DPS™ brand etch chambers of the inductively coupled plasma reactors disclosed in U.S. Pat. No. 5,753,044, entitled "RF PLASMA REACTOR WITH HYBRID CONDUCTOR AND MULTI-RADIUS DOME CEILING", for example, and assigned to Applied Materials, Inc. and fully incorporated herein by reference thereto as if repeated verbatim immediately hereinafter. Referring now to FIGS. 15 and 16 for two (2) embodiments of an inductively coupled plasma reactor from U.S. Pat. No. 5,753,044, there is seen an inductively coupled RF plasma reactor generally illustrated as 90, having a reactor chamber, generally illustrated as 92, wherein a high density plasma 94 (i.e. a plasma having an ion density greater than about $10^9/cm^3$, preferably greater than about $10^{11}/cm^3$) of neutral (n) particles, positive (+) particles, and negative (−) particles are found. The spirit and scope of the present invention would include employing the protective coating in a reactor chamber having a low density plasma. The reactor chamber 92 has a grounded conductive cylindrical sidewall 60 and a dielectric ceiling 62. The cylindrical sidewall 60 includes the protective coating 30 supported thereby. The inductively coupled RF plasma reactor 90 further comprises a wafer pedestal 64 for supporting the (semiconductor) wafer 10 in the center of the chamber 92, a cylindrical inductor coil 68 surrounding an upper portion of the chamber 92 beginning near the plane of the top of the wafer 10 or wafer pedestal 64 and extending upwardly therefrom toward the top of the chamber 92, an etching gas source 72 and inlet 74 for furnishing an etching gas into the interior of the chamber 92, and a pump 76 for controlling the pressure in the chamber 92. The coil inductor 68 shown in FIG. 15 is energized by a plasma source power supply or RF generator 78 through a conventional active RF match network 80, the top winding 98 of the coil inductor 68 being "hot" and the bottom winding 100 being grounded. The wafer pedestal 64 includes an interior conductive portion 82 connected to the bias rf power supply or generator 84 and an exterior grounded conductor 86 (insulated from the interior conductive portion 82). Thus, the plasma source power applied to the coil inductor 68 by the RF generator 78 and the DC bias RF power applied to the wafer pedestal 64 by generator 84 are separately controlled RF supplies. Separating the bias and source power supplies facilitates independent control of ion density and ion energy in accordance with well-known techniques. To produce high density plasma 94 as an inductively coupled plasma, the coil inductor 68 is adjacent to the chamber 92 and is connected to the RF source power supply or the RF generator 78. The coil inductor 68 provides the RF power which ignites and sustains the high ion density of the high density plasma 94 within the reactor chamber 92.

Uniformity of the plasma density spatial distribution of the high density plasma 94 across the wafer 10 is improved (relative to conical or hemispherical ceilings) by shaping the ceiling 62 in a multi-radius dome and individually determining or adjusting each one of the multiple radii of the ceiling 62. The multiple-radius dome shape in the particular embodiment of FIG. 15 somewhat flattens the curvature of the ceiling 62 around the center portion of the ceiling 62, the peripheral portion of the ceiling 62 having a steeper curvature.

As illustrated in FIG. 16 the coil inductor 68 may be coupled to the RF power source 78, 80 in a mirror coil configuration that is known to those skilled in the art. In the mirror coil configuration of FIG. 16, the RF source 78, 80 is connected to the center winding 102 of the coil inductor 68 while the top 104 and bottom 106 ends of the coil inductor 68 are both grounded. The mirror coil configuration has the advantage of reducing the maximum potential on the coil inductor 68.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A chamber assembly for processing substrates in a plasma, comprising:

a processing chamber including a processing zone adjacent a chamber wall, wherein said adjacent chamber wall comprises a protective structure including a layer of boron carbide with an overlying protective coating produced from at least one polymer resulting from a monomeric anaerobic chemical mixture having been cured in the absence of oxygen;

a pedestal assembly for supporting a substrate, disposed in said processing zone;

a processing power source;

a gas inlet for introducing at least one processing gas into said processing zone; and a power-transmitting member connected to said processing power source for transmitting power into said processing zone, to aid in sustaining a plasma from said at least one processing gas within said processing zone adjacent said chamber wall.

2. The chamber assembly of claim 1 wherein said monomeric anaerobic chemical mixture comprises a major proportion of at least one methacrylate compound and a minor proportion of an activator agent.

3. The chamber assembly of claim 1 wherein said monomeric anaerobic chemical mixture comprises from about 60% by weight to about 80% by weight tetraethylene glycol dimethacrylate, from about 10% by weight to about 30% by weight 2-hydroxyethyl methacrylate, and from about 2.5% by weight to about 3.5% by weight cumene hydroperoxide.

4. The chamber assembly of claim 1 wherein said monomeric anaerobic chemical mixture comprises from about 30% by weight to about 95% by weight tetraethylene glycol dimethacrylate, from about 4% by weight to about 50% by weight 2-hydroxyethyl methacrylate, and from about 1% by weight to about 5% by weight of an activator agent.

5. The chamber assembly of claim 1 wherein said chamber wall comprises a protective structure including an anodized aluminum oxide film, with said layer of boron carbide adhered to and overlying said aluminum oxide film and with said layer of boron carbide supporting said protective coating.

6. The chamber assembly of claim 5 wherein said monomeric anaerobic chemical mixture comprises a major proportion of at least one methacrylate compound and a minor proportion of an activator agent.

7. The chamber assembly of claim 6 wherein said monomeric anaerobic chemical mixture comprises from about 60% by weight to about 80% by weight tetraethylene glycol dimethacrylate, from about 10% by weight to about 30% by weight 2-hydroxyethyl methacrylate, and from about 2.5% by weight to about 3.5% by weight cumene hydroperoxide.

8. The chamber assembly of claim 1 wherein said monomeric anaerobic chemical mixture comprises from about 30% by weight to about 95% by weight tetraethylene glycol dimethacrylate, from about 4% by weight to about 50% by weight 2-hydroxyethyl methacrylate, and from about 1% by weight to about 5% by weight of an activator agent.

9. A plasma reactor which processes substrates, comprising:
   a reactor chamber including a chamber wall, a dielectric window supported by said chamber wall, and a protective structure including a layer of boron carbide with an overlying protective coating produced from a polymer formed from a monomeric anaerobic chemical mixture applied over said layer of boron carbide and cured in the absence of oxygen, wherein said protective structure is present over at least a portion of the inside of said reactor chamber wall during processing of at least one substrate;
   a pedestal assembly disposed in said reactor chamber for supporting a substrate;
   a processing power source;
   a gas inlet for introducing at least one processing gas into said reactor chamber; and
   a processing power-transmitting member connected to said processing power source for transmitting power into said reactor chamber, to aid in sustaining a plasma from said at least one processing gas within said reactor chamber.

10. The plasma reactor of claim 9 wherein said chamber wall comprises a protective structure including an anodized aluminum oxide film, with said boron carbide layer adhered to and overlying said aluminum oxide film and with said boron carbide layer supporting said polymer formed from a monomeric anaerobic chemical mixture.

11. The plasma reactor of claim 9 herein said monomeric anaerobic chemical mixture comprises a major proportion of at least one methacrylate compound and a minor proportion of an activator agent.

12. The plasma reactor of claim 9 wherein said monomeric anaerobic chemical mixture comprises from about 60% by weight to about 80% by weight tetraethylene glycol dimethacrylate, from about 10% by weight to about 30% by weight 2-hydroxyethyl methacrylate, and from about 2.5% by weight to about 3.5% by weight cumene hydroperoxide.

13. The plasma reactor of claim 9 herein said monomeric anaerobic chemical mixture comprises from about 30% by weight to about 95% by weight tetraethylene glycol dimethacrylate, from about 4% by weight to about 50% by weight 2-hydroxyethyl methacrylate, and from about 1% by weight to about 5% by weight of an activator agent.

14. A chamber wall of a reactor chamber for processing substrates in a plasma, comprising:
   a wall structure surface; a layer of boron carbide connected to said wall structure surface; and a protective coating disposed on said layer of boron carbide and comprising at least one polymer resulting from curing of a monomeric anaerobic chemical mixture in the obsence of oxygen.

15. The chamber wall of claim 14 wherein said monomeric anaerobic chemical mixture comprises a major proportion of at least one methacrylate compound and a minor proportion of an activator agent.

16. The chamber wall of claim 14 herein said monomeric anaerobic chemical mixture comprises from about 30% by weight to about 95% by weight tetraethylene glycol dimethacrylate, from about 4% by weight to about 50% by weight 2-hydroxyethyl methacrylate, and from about 1% by weight to about 5% by weight of an activator agent.

17. The chamber wall of claim 14 Wherein said wall structure surface comprises aluminum.

18. The chamber wall of claim 17 wherein said monomeric anaerobic chemical mixture comprises a major proportion of at least one methacrylate compound and a minor proportion of an activator agent.

19. The chamber wall of claim 18 wherein said monomeric anaerobic chemical mixture comprises from about 60% by weight to about 80% by weight tetraethylene glycol dimethacrylate, from about 10% by weight to about 30% by weight 2-hydroxyethyl methacrylate, and from about 2.5% by weight to about 3.5% by weight cumene hydroperoxide.

20. A protective structure to reduce corrosion of underlying plasma processing chamber wall surfaces, comprising: at least one ceramic layer, including a layer of boron carbide, said layer of boron carbide having deposited thereover a polymeric coating produced from a monomeric anaerobic chemical mixture which is cured in the absence of oxygen.

21. The protective structure of claim 20, wherein said at least one ceramic layer further includes a compound selected from the group consisting of aluminum oxide, aluminum nitride, boron nitride, silicon carbide, silicon nitride, zirconium oxide, and mixtures thereof.

22. The protective structure of claim 21, wherein at least two ceramic layers are present and where an underlying first ceramic layer is aluminum oxide, which is overlaid by a second ceramic layer of boron carbide, which supports said coating produced from a monomeric chemical mixture which is cured in the absence of oxygen.

23. The protective structure of claim 20, wherein said at least one ceramic layer is boron carbide.

24. The protective structure of claim 20, or claim 21, or claim 23, or claim 22, wherein said monomeric chemical mixture includes a methacrylate.

25. The protective structure of claim 24, applied over a metal surface.

26. The protective structure of claim 24, applied over a surface containing a metal selected from the group consisting of steel and aluminum.

27. The protective structure of claim 24, applied over an aluminum surface.

28. A protective structure for a plasma processing chamber wall, the protective structure comprising a boron carbide layer having deposited thereover a coating produced from a monomeric anaerobic chemical mixture which is cured in the absence of oxygen.

29. The protective structure of claim 28, applied over the surface of a ceramic layer selected from the group consisting of aluminum oxide, aluminum nitride, boron nitride, silicon carbide, silicon nitride, zirconium oxide, and mixtures thereof.

30. The protective structure of claim 28, applied over a metal-comprising structure.

31. The protective structure of claim 30, applied over a ceramic layer which overlays a comprising structure.

* * * * *